United States Patent
Krois et al.

(10) Patent No.: US 12,027,678 B2
(45) Date of Patent: Jul. 2, 2024

(54) THERMAL RUNAWAY DETECTION SYSTEM AND BATTERY SYSTEM

(71) Applicant: SAMSUNG SDI CO., LTD., Yongin-si (KR)

(72) Inventors: Günter Krois, Graz (AT); Michael Haindl, Hartberg (AT); Florian Altenburger, Weiz (AT)

(73) Assignee: Samsung SDI Co., Ltd., Yongin-si (KR)

( * ) Notice: Subject to any disclaimer, the term of this patent is extended or adjusted under 35 U.S.C. 154(b) by 839 days.

(21) Appl. No.: 17/127,610

(22) Filed: Dec. 18, 2020

(65) Prior Publication Data
US 2021/0194072 A1    Jun. 24, 2021

(30) Foreign Application Priority Data
Dec. 20, 2019 (EP) ..................... 19218474
Dec. 17, 2020 (KR) .................. 10-2020-0177630

(51) Int. Cl.
*H01M 10/48* (2006.01)
*B60Q 9/00* (2006.01)
(Continued)

(52) U.S. Cl.
CPC .............. *H01M 10/48* (2013.01); *B60Q 9/00* (2013.01); *G01L 19/14* (2013.01); *G01N 27/04* (2013.01);
(Continued)

(58) Field of Classification Search
CPC .. H01M 10/425; H01M 10/48; H01M 10/482; H01M 10/488; H01M 10/0525; H01M 50/204; H01M 50/249; H01M 50/317; H01M 50/572; H01M 2200/20; H01M 2010/4278; B60Q 9/00;
(Continued)

(56) References Cited

U.S. PATENT DOCUMENTS

| 2010/0047673 A1 | 2/2010 | Hirakawa et al. |
| 2011/0174556 A1 | 7/2011 | Hermann et al. |

(Continued)

FOREIGN PATENT DOCUMENTS

| CN | 109904366 A | * | 6/2019 |
| CN | 109904366 A |   | 6/2019 |

(Continued)

OTHER PUBLICATIONS

Extended European Search Report, issued in EP Application No. 19218474.5, dated Jun. 30, 2020, 7 pages.

(Continued)

*Primary Examiner* — Aaron L Troost
(74) *Attorney, Agent, or Firm* — Lewis Roca Rothgerber Christie LLP

(57) ABSTRACT

A thermal runaway detection system includes: a venting device including a sealing body in a venting passage and a thermal runaway detection circuit. The sealing body being configured to close the venting passage in a first position and to open the venting passage in a second position different from the first position. The thermal runaway detection circuit being configured to monitor a position of the sealing body and to output a signal corresponding to the position of the sealing body.

15 Claims, 3 Drawing Sheets

(51) Int. Cl.
  *G01L 19/14*   (2006.01)
  *G01N 27/04*   (2006.01)
  *G01R 19/165*  (2006.01)
  *H01M 10/0525* (2010.01)
  *H01M 50/204*  (2021.01)
  *H01M 50/249*  (2021.01)
  *H01M 50/317*  (2021.01)

(52) U.S. Cl.
  CPC .. *G01R 19/16571* (2013.01); *H01M 10/0525* (2013.01); *H01M 50/204* (2021.01); *H01M 50/249* (2021.01); *H01M 50/317* (2021.01); *H01M 2200/20* (2013.01); *H01M 2220/20* (2013.01)

(58) Field of Classification Search
  CPC .. G01L 19/14; G01N 27/04; G01R 19/16571; Y02E 60/10
  See application file for complete search history.

(56) References Cited

U.S. PATENT DOCUMENTS

| | | |
|---|---|---|
| 2012/0070703 A1 | 3/2012 | Wahl et al. |
| 2016/0111757 A1 | 4/2016 | Kim et al. |
| 2022/0238927 A1* | 7/2022 | Dietrich .............. H01M 10/425 |

FOREIGN PATENT DOCUMENTS

| | | |
|---|---|---|
| DE | 102014200193 A1 | 7/2015 |
| EP | 2077592 A1 | 7/2009 |
| JP | 2005-322471 A | 11/2005 |

OTHER PUBLICATIONS

European Office action issued in corresponding EP Application No. 19218474.5, dated Mar. 31, 2021, 4 pages.

* cited by examiner

THERMAL RUNAWAY DETECTION SYSTEM AND BATTERY SYSTEM

CROSS-REFERENCE TO RELATED APPLICATION

This application claims priority to and the benefit of European Patent Application No. 19218474.5, filed on Dec. 20, 2019, and Korean Patent Application No. 10-2020-0177630, filed on Dec. 17, 2020, the entire content of each of which is incorporated herein by reference.

BACKGROUND

1. Field

Aspects of embodiments of the present disclosure relate to a thermal runaway detection system and a battery system including the same.

2. Description of Related Art

A rechargeable (or secondary) battery differs from a primary battery in that it is designed to be repeatedly charged and discharged, while the latter is designed to provide an irreversible conversion of chemical to electrical energy. Low-capacity rechargeable batteries may be used as power supplies for small electronic devices, such as cellular phones, notebook computers, and camcorders, while high-capacity rechargeable batteries may be used as power supplies for hybrid vehicles and the like.

In general, rechargeable batteries include an electrode assembly including a positive electrode, a negative electrode, and a separator interposed between the positive and negative electrodes, a case receiving (or accommodating) the electrode assembly, and an electrode terminal electrically connected to the electrode assembly. An electrolyte solution is injected into the case to enable charging and discharging of the battery via an electrochemical reaction of the positive electrode, the negative electrode, and the electrolyte solution. The shape of the case, such as cylindrical or rectangular, may be selected or determined based on the battery's intended purpose.

Rechargeable batteries may be used as a battery module formed of a plurality of unit battery cells coupled to each other in series and/or in parallel to provide a high energy density for, as an example, motor driving of a hybrid vehicle. For example, the battery module may be formed by interconnecting the electrode terminals of the plurality of unit battery cells depending on a desired amount of power and to realize a high-power rechargeable battery for, as an example, an electric vehicle.

Battery modules may be constructed either in block design or in modular design. In the block design, each battery cell is coupled to a common current collector structure and a common battery management system. In the modular design, pluralities of battery cells are connected to each other to form submodules, and several submodules are connected to each other to form the battery module. Battery management functions may be realized either on the module or submodule level and, thus, interchangeability of the components is improved. One or more battery modules may be mechanically and electrically integrated, equipped with a thermal management system, and configured to communicate with one or more electrical consumers to form a battery system.

A casing (or housing) may be provided either at the battery submodule level, at the battery module level, or at the battery system level to enclose all the components constituting the respective unit (or level). To provide thermal control of the enclosed components, a thermal management system may be used to efficiently emit, discharge, and/or dissipate heat generated within the casing. If such a thermal management system is omitted or the heat removal (or drain) from the casing is not sufficiently performed, an increase in the internal temperature can lead to abnormal reactions occurring therein. An example of such abnormal operation condition is a thermal runaway of a battery cell that may occur due to overheating or overcharging the lithium ion cell. Thermal runaway is a self-accelerating chemical reaction inside the cell, which produces high amounts of heat and gas, until all available material is exhausted. Due to high amounts of hydrogen and carbon monoxide within the produced gas, the produced gases may be toxic and flammable.

A thermal runaway will likely cause a thermal propagation along the battery cells of a battery module, which might eventually lead to a fire in the battery module. Hence, early detection of a thermal runaway in a battery module is important for the timely initiation of countermeasures and/or the timely output of warning signals, for example, to the passengers of an electric vehicle. So far, the detection of thermal runaway is usually based on internal cell measurements, for example, on measurements of cell voltage, cell current, and/or cell temperature. In other words, so far the thermal runaway itself is not detected but rather secondary effects related to a thermal runaway are detected within a battery module. Further, to avoid false warnings, trigger thresholds are usually set which relate to (or indicate) thermal propagation across at least two cells, for example, by detecting abnormal cell voltages, currents, and/or temperatures of at least two cells. However, these trigger thresholds are often based on specific battery system models, and hence, might not be suitable for all battery modules irrespective of geometry.

SUMMARY

Aspects of the present disclosure overcome or at least reduce the disadvantageous of the prior art and solve at least one of the problems existing in the prior art to at least some extent.

Aspects of embodiments of the present disclosure overcome or reduce at least some of the drawbacks of the prior art and provide thermal runaway detection that provides reliable detection of thermal runaway itself rather than detecting its secondary effects.

According to an embodiment of the present disclosure, a thermal runaway detection system is provided that includes a venting device and a thermal runaway detection circuit. The venting device has a sealing body that is disposed in a venting passage (e.g., in a passage or opening) that is configured to let pass (to vent) venting gases in (or during) a thermal runaway of a battery cell. The sealing body is configured to close the venting passage in a first position of the sealing body and is configured to open the venting passage in a second position of the sealing body that is different from the first position. In the context of the present disclosure, a position of the sealing body refers to a spatial position of the sealing body without a change of state of the sealing body. Thus, the sealing body remains unaltered in the first and second position.

The thermal runaway detection system according to an embodiment of the present disclosure further includes a thermal runaway detection circuit that is configured to monitor a position of the sealing body and to output a signal corresponding to the position of the sealing body. The monitoring of the position of the sealing body is performed by the selective closing and opening (e.g., setting conductive and non-conductive) of a conductive circuit based on a position of the sealing body as described in more detail below. However, the position of the sealing body may also be measured by using optical and/or mechanical devices. For example, a laser may be selectively interrupted based on a position of the sealing body and may be detected by a photodiode when it is not interrupted. Hence, a signal output by the photodiode may be used to monitor the position of the sealing body. Also, a capacitive measurement may be carried out to determine the position of the sealing body, and the sealing body may be configured as a movable plate of a capacitor. However, the present disclosure is not limited to these examples, and a mechanical device, such as a gear rack or the like, may be used to determine the position of the sealing body. Depending on the method or device used to determine the position of the sealing body, corresponding circuitry may be used to output the signal.

Generally, a battery cell has a vent opening to allow (e.g., to selectively allow or permit) gas produced in the battery cell during an abnormal operation condition to be released from the cell when a reference overpressure and/or a reference temperature inside the cell is exceeded. The vent opening is usually covered (e.g., sealed) by a membrane that bursts open when a pressure inside the battery cell exceeds a reference pressure threshold. In other embodiments, the vent opening is covered by a notched portion of a cap plate to allow the portion of the cap plate to burst open when a pressure inside the battery cell exceeds a reference pressure threshold. Thus, once the vent opening opens, it cannot close (or seal) the cell housing again and the battery cell can no longer be used and usually has to be disposed.

The casing of a battery submodule, battery module, or battery system usually also encloses the components therein in an essentially gas tight manner, and thus, an opening in the submodule, module, or system casing (e.g., housing) is often included to prevent damage to the casing and its sealing due to highly increased interior pressure. Such an opening also allows for venting away (or expelling) the venting gases safely to protect persons from dangerous fumes and gases that may occur during thermal runaway or other dysfunctions of battery cells within the casing. For fast venting of vent gases, the opening should be configured to open at a reference pressure inside the casing.

According to embodiments of the present disclosure, the sealing body in such an opening is configured to affect the opened state or the closed state of the opening is used to determine a thermal runaway of at least one battery cell within the casing (housing). Hence, according to embodiments of the present disclosure, a thermal runaway of, for example, a battery submodule, battery module, or battery system disposed within the housing can be determined almost immediately (e.g., with a very quick response time) as the pressure rises immediately during a venting event of a battery cell within the housing. Further, the detection of the thermal runaway is independent of internal battery measurements, such as measurements of voltage or temperature of a battery cell, which might be impaired by thermal propagation. Further, utilizing the opening state of a venting device for thermal runaway detection provides a low risk of false warnings of thermal runaway, as common venting devices are configured to open only due to a sufficient overpressure inside the casing.

In one embodiment, the thermal runaway detection circuit of the thermal runaway detection system has a first detection node that is connected to the venting device and a second detection node that is connected to the venting device. Thus, a conductive path is formed between the first and second detection nodes of the thermal runaway detection circuit, respectively, and the venting device. The venting device includes first and second contact nodes (e.g., contact pads) to enable the contact to the detection nodes.

According to embodiments of the present disclosure, a conductive (e.g., conductible) path between the first detection node and the second detection node is set conductive via the sealing body in one of the first position and the second position. Hence, the conductive path between the first and second detection nodes is set non-conductive in the other one of the first position and the second position of the sealing body. For example, the conductivity of the conductible path depends on whether or not the sealing body is opened or closed (i.e., seals) the venting passage. Hence, the conductivity of the conductive path indicates whether or not the venting passage is open or closed.

The thermal runaway detection circuit according to an embodiment of the present disclosure further includes a controller that is configured to detect the conductivity of the conductive path and to output a signal corresponding to the conductivity of the conductive path. The controller may be configured to measure a voltage and/or current on the conductive path or is configured to control a device to measure a voltage and/or current on the conductive path. The controller is further configured to determine the conductivity of the conductive path based on the obtained measurement signals. The signal corresponding to the conductivity of the conductive path generated by the controller takes different values for different conductivity states of the conductive path. For example, a value of the signal may correspond to the conductivity in absolute numbers (e.g., may be a measure of the conductivity). In other embodiments, the signal may take a first value for a conductivity below a reference threshold and a second value for a conductivity above a reference threshold. Further, one of the first and second values may be zero.

In an embodiment of the present disclosure, the sealing body is moveable from the first position to the second position in a reversible manner. Hence, once the pressure drops below the reference pressure threshold, the sealing body transfers (or reverts) back to the first position to close the venting passage. Hence, during a normal operation state, the venting device closes the venting passage to ensure protection from environmental influences. Hence, even if the sealing body moves to the second position to allow vent gases to be emitted via the venting passage, the thermal runaway detection system can be reused afterwards.

In an embodiment, the venting device is disposed in a housing, such as the housing of a battery submodule, a battery module, or a battery system. According to this embodiment, the venting device is configured to transition from the first position to the second position when a pressure within the housing exceeds a reference (or predefined) pressure threshold. Hence, because the venting device is reversibly transferable between the first and second positions, the casing (housing) can even be used after the occasion of a venting event of at least one battery cell within the housing. Also, the sealing body protects the inside of the casing (housing) from environmental influences while it is in the first state (e.g., when the venting passage is closed).

In an embodiment of the present disclosure, the conductive path between the first detection node and the second detection node is set conductive via the sealing body being in the first position. For example, when the sealing body closes the venting passage, the sealing body provides an electric closure to the conductive path. For example, the conductible path is set non-conductive when the sealing body is in the second position.

According to this embodiment, contact areas between the sealing body and a corresponding sealing surface against which the sealing body abuts to seal the venting passage may be formed as electric contacts. Further, the sealing body is electrically conductive or includes an electrically conductive path. Hence, when the sealing body seals the venting passage and abuts against the contact areas, it closes the conductive path between the first and second detection nodes. In one embodiment, the sealing body is a valve plate, and the venting device further includes a spring to push (or bias) the valve plate into the second (closed) position. Further, the sealing body is an electrically conducting part of the conductible path, at least while the sealing body is in the first position to close the venting passage. In other words, the sealing body electrically closes the conductive path while it is in the first position.

Further, the thermal runaway detection circuit has a first power input connected to a first cell terminal of at least one battery cell and a second power input connected to a second cell terminal of at least one battery cell. In one embodiment, at least one battery cell is the same battery cell, the venting of which effects a transition of the sealing body from the first position into the second position. In other words, according to this embodiment, the thermal runaway detection circuit, particularly the controller thereof, is self-supplied by the at least one battery cell that is supervised by the thermal runaway detection system. That is, the controller is connected to the first power input and to the second power input, and the controller is powered via the at least one battery cell.

Further, the first detection node of the circuit is connected to the first power input, and the second detection node of the circuit is connected to the second power input. The first detection node of the circuit may be connected to the first power input via the controller or independently of the controller. The second detection node of the circuit may be connected to the second power input via the controller or independently of the controller. The first detection node differs from the first power input, and the second detection node differs from the second power input. In some embodiments, the controller is supplied with power via the first power input and second power input and is independent of the conductivity state of the conductive path. In other words, the controller and the conductive path (i.e., the venting device with the sealing body) are connected in parallel to each other with respect to the at least one battery cell operating as power supply.

Further, the controller of the thermal runaway detection system, for example, of the thermal runaway detection circuit, is configured to output the signal while the conductive path is set conductive. According to this embodiment, when the controller detects a property of the conductive path (e.g., a voltage or current along the conductive path), a high signal corresponding to this property may be in the controller (e.g., the controller may detect a property of the conductive path as a high signal). Such a high signal in the controller is then output or at least used to output the signal indicative of the conductivity of the conductive path. For example, the controller according to this embodiment may detect a signal corresponding to the conductivity of the conductive path to determine this conductivity and at the same time outputs this signal corresponding to the conductivity of the conductive path. In this embodiment, the circuitry of the controller might be relatively simple.

In another embodiment, the controller is configured to output the signal when a current across the conductive path falls below a reference (or predetermined) current threshold. According to such embodiment, the controller is configured to detect a current across the conductive path and is further configured to compare this measured current with a reference (or preset) current. Such a comparison may be performed by using a comparator or the like. According to this embodiment of the present disclosure, the thermal runaway detection system further includes a shunt resistor that is interconnected between the first power input and the first detection node or between the second power input and the second detection node. For example, the shunt resistor may be integrated into an extension of the conductive path on the thermal runaway detection circuit, for example on a substrate carrier carrying this circuit. According to this embodiment, the controller is further configured to detect a voltage drop over the shunt resistor and to determine a current along the conductive path based on the voltage drop detected over the shunt resistor. In this embodiment, the controller may be connected to a node upstream of the shunt to tap a voltage upstream of the shunt and to another node downstream of the shunt resistor in order to tap a voltage downstream of the shunt.

The electronic or electric devices and/or any other relevant devices or components according to embodiments of the present disclosure may be implemented utilizing any suitable hardware, firmware (e.g., ASIC), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein.

The computer program instructions are stored in a memory which may be implemented in a computing device by using a standard memory device, such as, for example, a random access memory (RAM). The computer program instructions may also be stored in other non-transitory computer readable media, such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

Another embodiment of the present disclosure relates to a battery submodule that includes a plurality of aligned battery cells. The battery submodule further includes a submodule housing that encloses the plurality of aligned battery cells. The battery submodule further includes the claimed thermal runaway detection system as described above, and the venting device is disposed in the venting passage of the battery submodule housing. Some embodiments of the battery submodule correspond to the embodiments of the thermal runaway detection system as described above. For example, the venting passage of the thermal runaway detection system of the present disclosure connects the interior of the battery submodule housing with the exterior of the battery submodule housing depending on the position of the sealing body being one of the first or second position.

Another embodiment of the present disclosure relates to a battery module that includes a plurality of battery submodules, each battery submodule including a plurality of aligned battery cells. The battery module includes a plurality of battery submodules according to an embodiment of the present disclosure as described above. The battery module further includes a module housing enclosing the battery submodules and the thermal runaway detection system according to an embodiment of the present disclosure as described above. Therein, the venting device is disposed in the venting passage of the battery module housing. In other words, the venting passage of the thermal runaway detection system of the present disclosure connects the interior of the battery module housing with the exterior of the battery module housing depending on the position of the sealing body being one of the first or second position. Embodiments of the battery module correspond to or include the thermal runaway detection system according to embodiments as described above.

Another embodiment of the present disclosure relates to a battery system that includes at least one battery module and a system controller configured to operate the at least one battery module. The system controller may be is a battery management system configured to detect states of the battery cells of the battery module, perform balancing of the cells, and/or to establish a communication connection with external loads or the like. The battery module may include at least one battery submodule, and each battery submodule has a plurality of aligned battery cells stacked together. The battery system further includes a system housing and the thermal runaway detection system according to an embodiment of the present disclosure as described above. Therein, the venting device is disposed in the venting passage of the battery system housing. In other words, the venting passage of the thermal runaway detection system of the present disclosure connects the interior of the battery system housing with the exterior of the battery system housing depending on the position of the sealing body being one of the first or second position, such as the first position. Embodiments of the battery system correspond to embodiments of the thermal runaway detection system as described above.

Another embodiment of the present disclosure is directed to a vehicle that includes a battery submodule as described above, a battery module as described above, and/or a battery system as described above and further includes at least one vehicle control unit that is configured to receive the signal that is output from the controller and corresponds to the conductivity state of the conductive path. The vehicle includes at least one output means (e.g., an output device configured to output a signal), and the vehicle control unit is further configured to output a warning to a passenger based on the received signal. The vehicle may include a display for outputting a visual warning to a passenger. Alternatively or additionally, the vehicle may include a speaker for outputting an audible warning to a passenger for warning the passenger. Above that, the vehicle may provide a haptic warning to a passenger, such as a vibration.

Another embodiment of the present disclosure relates to a method for detecting a thermal runaway of at least one battery cell of a plurality of battery cells disposed within a housing in which a venting device with a sealing body is disposed in a venting passage of the housing. Therein, the sealing body is configured to close the venting passage in a first position and to open the venting passage in a second position different from the first position in response to a reference (or predefined) pressure within the housing. Further, the sealing body is configured to set a conductive path conductive in one of the first state and the second state and to set the conductive path non-conductive in the other state. The method according to embodiments of the present disclosure includes detecting, via a controller that is configured to detect a conductivity of the conductive path, a conductive state of the conductive path and outputting a first signal. The method of the present disclosure further includes detecting, via the controller, a non-conductive state of the conductive path and outputting a second signal. Therein, one of the first and second signals indicates a thermal runaway of a battery cell.

In one embodiment, the method according to embodiments of the present disclosure further includes outputting a warning and/or performing at least one countermeasure in response to the signal indicating a thermal runaway. As described above with respect to the vehicle of the present disclosure, the warning may be output via at least one output device of, for example, an electric vehicle. The countermeasure may include shutting down at least one up to and including all of the plurality of battery cells and/or emitting a fire extinguishing (and or cooling) substance to one up to and including all of the plurality of battery cells. Further, the countermeasure may include increasing the cooling performance of a cooling system of the at least one battery cell and/or activating a device to increase thermal conductivity between the plurality of battery cells by, for example, activating additional ventilation devices, such as ventilation fans. The method according to embodiments of the present disclosure further includes stopping the output of the warning and/or the performance of the countermeasure in response to the other signal that does not indicate a thermal runaway. Therein, the warning and/or the countermeasure is one of those warning and countermeasures as described above.

Another embodiment of the present disclosure relates to a computer program including instructions which, when the program is executed by a controller of a thermal runaway detection system as described above, cause the controller to carry out the method according to embodiments of the present disclosure as described above. Therein, the controller may control other elements of the thermal runaway detection system for carrying out the method. Other aspects and features of the system and method according to embodiments of the present disclosure may be learned by the following description of the drawings and the dependent claims.

BRIEF DESCRIPTION OF THE DRAWINGS

Aspects and features of the present disclosure will become apparent to those of ordinary skill in the art by describing, in detail, exemplary embodiments with reference to the attached drawings, in which.

DETAILED DESCRIPTION

Figure 1:
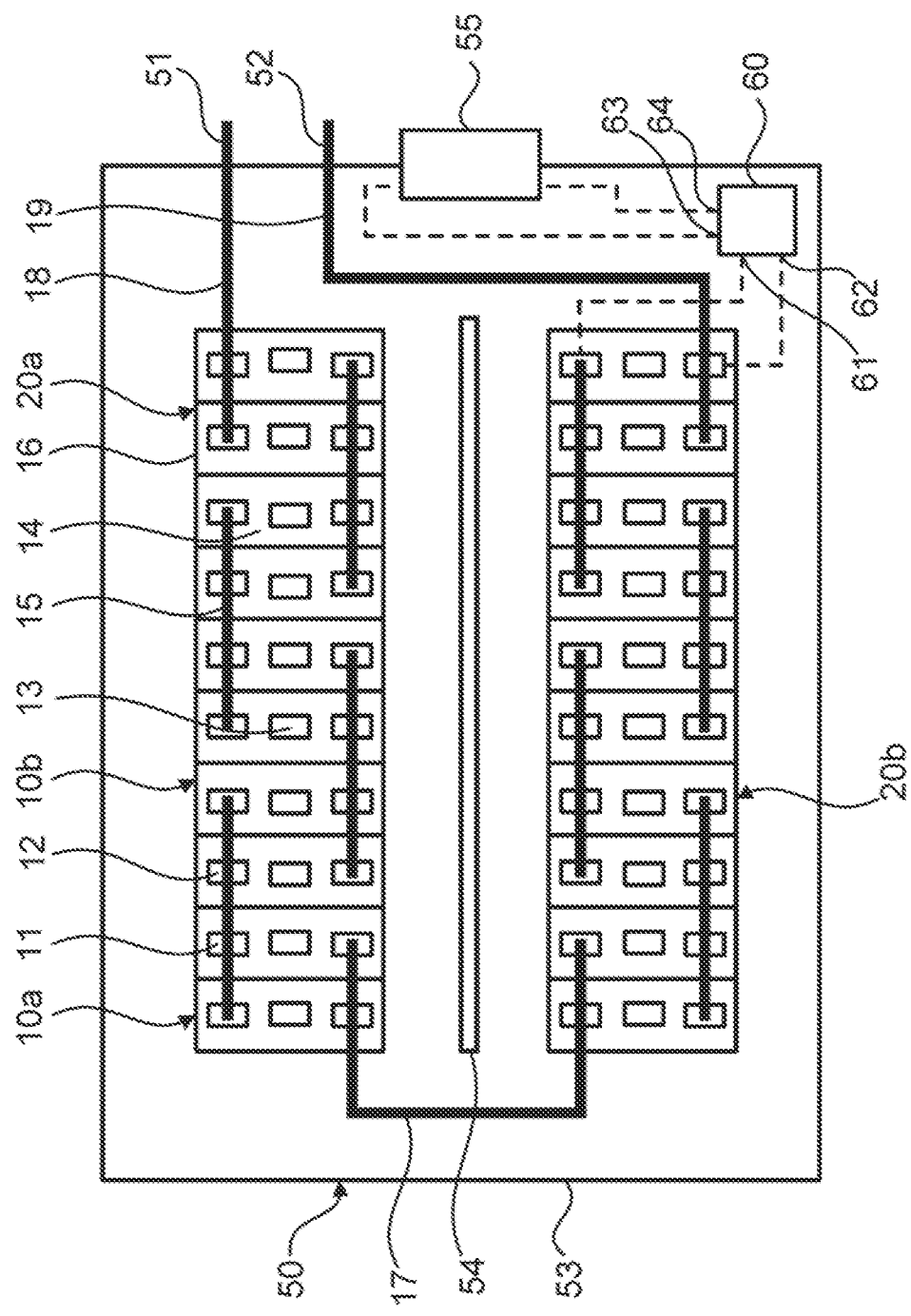
FIG. 1 is a schematic illustration of a battery module according to an embodiment.

Reference will now be made, in detail, to embodiments, examples of which are illustrated in the drawings, and aspects and features of the embodiments will be described with reference to the accompanying drawings. In the drawings, like reference numerals denote like elements, and redundant descriptions of same reference elements may be omitted. Aspects and features of the inventive concept and methods of accomplishing the same may be understood more readily by reference to the following detailed description of embodiments and the accompanying drawings. The present disclosure, however, may be embodied in various different forms and should not be construed as being limited to the illustrated embodiments.

As used herein, the term "and/or" includes any and all combinations of one or more of the associated listed items. Further, the use of "may" when describing embodiments of the present disclosure refers to "one or more embodiments of the present disclosure." It will be understood that although the terms "first" and "second" are used to describe various elements, these elements should not be limited by these terms. These terms are used to distinguish one element from another element. For example, a first element may be named a second element and, similarly, a second element may be named a first element.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Unless otherwise defined, all terms (also technical and scientific terms) used herein have the same meaning as commonly understood by one of ordinary skill in the art. It will be further understood that terms, such as those defined in common dictionaries, should be interpreted as having a meaning that is consistent with their meaning in the context of the relevant art and/or the present specification, and should not be interpreted in an idealized or overly formal manner.

FIG. 1 is a perspective view illustrating a battery module 50 according to an embodiment. The battery module 50 illustrated in FIG. 1 may be a battery module 50 as utilized in an electric vehicle. The battery module 50 includes a housing 53 having a plurality of (e.g., four) lateral exterior walls and a single linearly extended partition wall 54 arranged at a center of the housing 53. The housing 53 may be closed by a top cover and is an essentially gastight housing.

The partition wall 54 divides the housing 53 in two submodule compartments. Battery submodules 20 are arranged in both of the submodule compartments. Each of the battery submodules 20 includes a plurality of (e.g., ten) aligned battery cells 10 that are stacked in a stacking direction with their wide side surfaces facing each other. The stacking direction of the battery submodules 20 is also the longitudinal direction of the battery module 50 along which the battery module 50 has its largest extension (e.g., its longest extension length). The battery submodules 20 are positioned in the submodule compartments with their longitudinal direction essentially parallel to the partition wall 54. In the following description, a first battery submodule 20a is primarily described, the configuration of which is identical or substantially similar to the second battery submodule 20b, which also forms part of battery module 50.

The first battery submodule 10a includes a plurality of (e.g., ten) battery cells 10, and each of the battery cells 10 of the first battery submodule 10a includes an electrode assembly accommodated in a case 16 together with an electrolyte. The case 16 of each battery cell 10 may have a substantially cuboidal or prismatic shape and may be formed of a metal, such as aluminum. Each battery cell 10 may further include a cap assembly 14 for sealing an opening of the case 16. Each cap assembly 14 includes a cap plate for covering an opening in the case 16, a first cell terminal 11 (e.g., a positive terminal), and a second cell terminal 12 (e.g., a negative terminal). The cell terminals 11, 12 protrude from the cap assembly 14. The cap assembly 14 includes a vent 13 which has a vent opening that is covered by a membrane or has a notch (e.g., a notch in the cap assembly 14). The membrane or notched portion of the cap assembly 14 is configured to open in response to a certain overpressure within the battery cell 10.

The battery cells 10 of the first battery submodule 20a are connected to each other via busbars 15 in, for example, a 2p5s configuration. The battery cells 10 of the second battery submodule 20b are connected to each other via busbars 15 in the same configuration. However, in other embodiments, the battery cells in the different battery submodules 20a, 20b may be respectively connected to each other in different configurations. Each busbar 15 connects two first cell terminals 11 of first battery cells 10a with two second cell terminals 12 of second battery cells 10b. That is, each busbar 15 may connect a total of four cell terminals 11, 12 to each other.

Further, the first battery submodule 20a is connected to the second battery submodule 20b via an interconnector (e.g., a busbar) 17, and the interconnector 17 interconnects first terminals (e.g., two first terminal) 11 of the second battery submodule 20b with second terminals (e.g., two second terminals) 12 of the first battery submodule 20a. Further, first terminals (e.g., two first terminals) 11 of the first battery submodule 20a are connected to a first module terminal (e.g., a positive terminal) 51 via a first terminal connector 18, and second terminals (e.g., two second terminals) 12 of the second battery submodule 20b are connected to a second module terminal (e.g., a negative terminal) 52 via a second terminal connector 19. A high current path is formed by the busbars 15, the interconnector 17, and the terminal connectors 18, 19. This high current path extends from the first module terminal 51 along the battery cells 10 of the battery submodules 20a, 20b to the second module terminal 52.

According to an embodiment, the battery module 50 further includes a thermal runaway detection system. For example, the battery module 50 may include a venting device (e.g., a vent) 55 that is disposed in a lateral exterior wall of the housing 53 of the battery module 50. The battery module 50 may further include a thermal runaway detection circuit 60. The thermal runaway detection circuit 60 has a first power input 61 connected to first terminals of cells of the second battery module 20b and a second power input 62 connected to second terminals of cells of the first battery module 20a. Hence, power is supplied to the thermal runaway detection circuit 60 at least by part of the battery module 50. The thermal runaway detection circuit 60 further includes a first detection node 63 connected to the venting device 55 and a second detection node 64 also connected to the venting device 55. The venting device 55 includes a sealing body (e.g., a seal) configured to seal a venting passageway in the exterior lateral wall of the battery module 50 depending on its positions. Further, the thermal runaway detection circuit 60 is configured to monitor the position of the sealing body via the first detection node 63 and the second detection node 64. Based on the monitored (or determined) position of the sealing body, the thermal runaway detection circuit 60 outputs a signal that is indicative of the position of the sealing body. Thus, based on the signal output by thermal runaway detection circuit 60, a thermal runaway is reliably detected.

Figure 2:
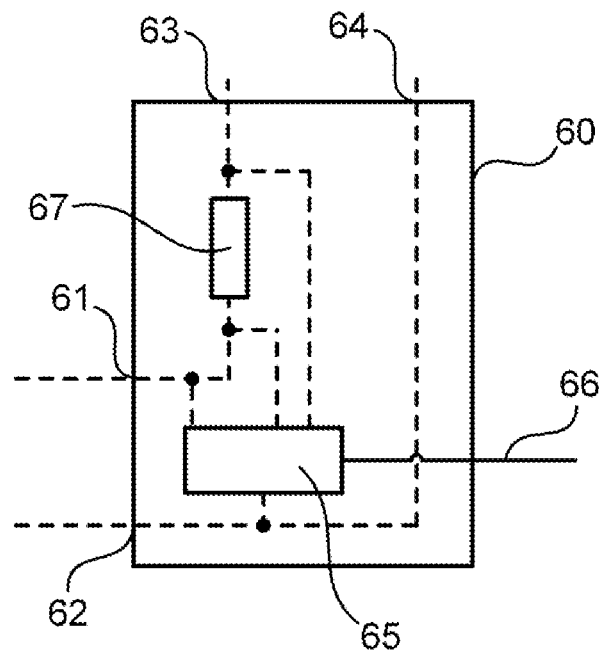
FIG. 2 is a schematic illustration of a thermal runaway detection circuit according to an embodiment.
Figure 3:
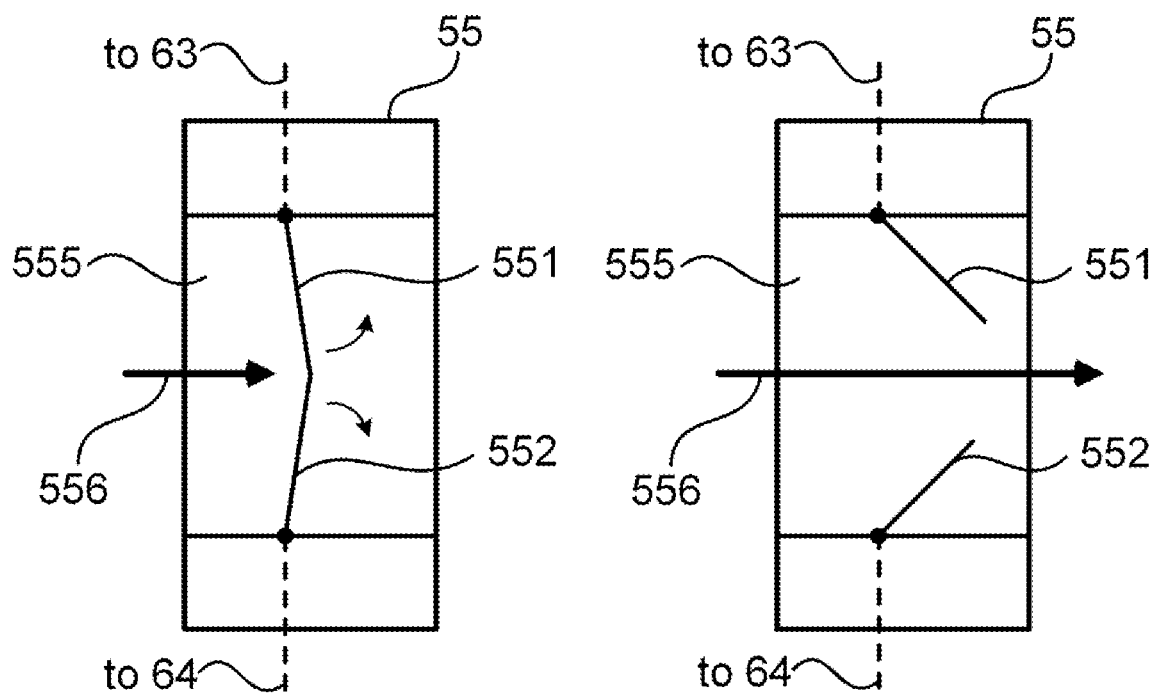
FIG. 3 is a schematic illustration of a venting device according to a first embodiment.
Figure 4:
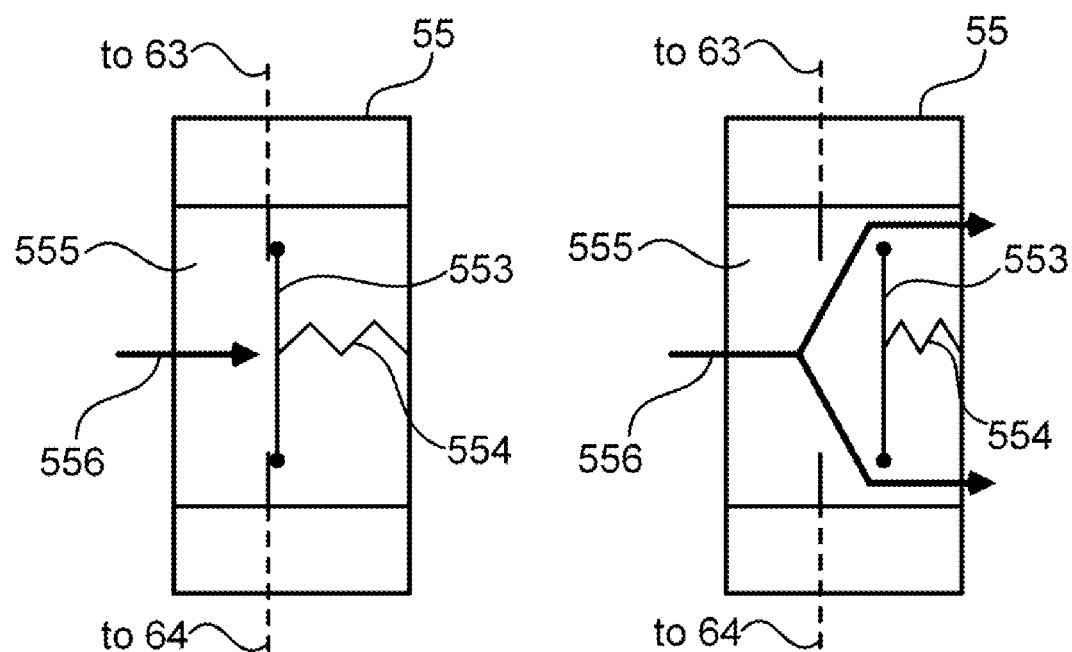
FIG. 4 is a schematic illustration of a venting device according to a second embodiment.

An embodiment of the thermal runaway detection circuit 60 is schematically illustrated in FIG. 2, and embodiments of the venting device 55 are schematically illustrated in FIGS. 3 and 4. These embodiments are described below with respect to the integration in the battery module 50 shown in FIG. 1. However, the embodiments of the thermal runaway detection circuit 60 and the venting device 55 described herein may also be used independently of the battery module 50 shown in FIG. 1 (e.g., in a battery system).

As schematically illustrated in FIG. 2, the thermal runaway detection circuit 60 has a conductive path (shown as dashed line) that connects the first power input 61 and the first detection node 63. The thermal runaway detection circuit 60 also includes another conductive path (also shown as dashed line) that connects the second power input 62 and the second detection node 64. Further, a controller 65 is interconnected between these conductive paths and, thus, is connected to the first and second power inputs 61, 62. Thus, power is supplied to the controller 65 by the second battery submodule 20b shown in FIG. 1. Further, a shunt resistor 67 is disposed in the conductive path between the first power input 61 and the first detection node 63. The controller 65 is connected to a first voltage measurement node downstream of the shunt resistor 67 and to a second voltage measurement node upstream of the shunt resistor 67. The controller 65, thus, taps a first voltage downstream of the shunt resistor 67 and a second voltage upstream of the shunt resistor 67 and is configured to determine a voltage drop over (or through) the shunt resistor 67. Based on a known (or set or reference) resistivity of the shunt resistor 67, the controller 65 determines a current through the shunt resistor 67 and, thus, a current through the first detection node 63. Because the first detection node 63 and the second detection node 64 are connected via the venting device 55 as illustrated in FIG. 1, the current through the first detection node 63 is also indicative for the current through the venting device 55 and can be used to monitor (or determine) a position of the sealing body in the venting device 55. This will be explained in more detail with respect to the embodiments shown in FIGS. 3 and 4.

As schematically illustrated in FIG. 3, the venting device 55 has a venting passage 555 that connects (or extends between) an interior and an exterior of the housing 53. The venting passage 555 is selectively opened or closed based on the positions of a first sealing body 551 and of a second sealing body 552. Each of the sealing bodies 551, 552 is connected to a lateral wall of the venting passage via a respective torsion spring.

The torsion springs are pre-stressed such that the first and second sealing body 551, 552 abut against each other to close the venting passage 555 in a first position (or first state) as illustrated in the left part of FIG. 3. Further, each of the first and second sealing body 551, 552 includes (or is made of) a conductive material, such as aluminum. Further, the first sealing body 551 is connected to the first detection node 63, and the second sealing body 552 is connected to the second detection node 64. Hence, when the first and second sealing body 551, 552 abut against each other, a conductive path between the first detection node 63 and the first detection node 64 is closed via the first and second sealing bodies 551, 552.

When a pressure inside the housing 53 exceeds a reference (or predefined) threshold, the first and second sealing bodies 551, 552 move against the spring force exerted by the respective torsion springs into a second position (or second state) as illustrated in the right part of FIG. 3. In the second position, the first and second sealing bodies 551, 552 do not abut against each other and open the venting passage 555, thus allow a venting gas 556 emitted by at least one of the battery cells 10 in the housing 53 to exit the housing 53 via the venting passageway 555. At the same time, the conductive path between the first and second detection nodes 63 and 64 is opened (i.e., set non-conductive), such that the thermal runaway detection circuit 60 (see, e.g., FIG. 2) can detect the second position of the first and second sealing bodies 551, 552 and output a signal 66 that is indicative of the first and second sealing bodies 551, 552 being in a second position and that a venting event related to a thermal runaway occurred.

Another embodiment of venting device 55 is schematically illustrated in FIG. 4. The venting device 55 shown in FIG. 4 includes a single sealing body 553 that is pressed by a linear spring 554 to contact areas of the venting device 55 to close the venting passage 555. The venting passage 555 is closed in a first position (or first state) of the sealing body 553 as illustrated in the left part of FIG. 5, and a venting gas 556 is blocked from being emitted from the housing 53. As the same time, a conductive path between the first detection node 63 and the second detection node 64 is closed by the conductive sealing body 553.

However, when the pressure inside the housing 53 exceeds a reference (or predetermined) value and a force exerted by this pressure on the sealing body 553 exceeds a force exerted by the spring 554, the sealing body 553 moves from the first position (or first state) to a second position (or second state) as illustrated in the right side of FIG. 4. In the second position, the venting passage 555 is open and, thus, a venting gas 556 emitted by at least one of the battery cells 10 in the housing 53 can be emitted from the housing 53 via the venting passageway 555. At the same time, the conductive path between the first and second detection nodes 63 and 64 is open (i.e., set non-conductive), such that the thermal runaway detection circuit 60 (see, e.g., FIG. 2) can detect the second position of the sealing body 553 and output a signal 66 that is indicative of such second position and that a venting event connected to a thermal runaway has occurred.

SOME REFERENCE NUMERALS 10 battery cell
11 first cell terminal (e.g., positive cell terminal)
12 second cell terminal (e.g., negative cell terminal)

13 vent
14 cap assembly
15 busbar
16 housing
17 submodule interconnector
18 first terminal connector
19 second terminal connector
20 battery submodule
50 battery module
51 first module terminal (e.g., positive terminal)
52 second module terminal (e.g., negative terminal)
53 housing
54 partition wall
55 venting device
551 first swiveling sealing body
552 second swiveling sealing body
553 movable sealing body
554 spring
555 venting passage
556 venting gas flow
60 thermal runaway detection circuit
61 first power input
62 second power input
63 first detection node
64 second detection node
65 controller
66 signal output
67 shunt resistor

What is claimed:

1. A thermal runaway detection system comprising:
a venting device comprising a sealing body in a venting passage, the sealing body being configured to close the venting passage in a first position and to open the venting passage in a second position different from the first position; and
a thermal runaway detection circuit configured to monitor a position of the sealing body and to output a signal corresponding to the position of the sealing body, the thermal runaway detection circuit comprising:
a first power input connected to a first cell terminal of a battery cell and a second power input connected to a second cell terminal of the battery cell;
a first detection node connected to the venting device;
a second detection node connected to the venting device;
a shunt resistor interconnected between the first power input and the first detection node or between the second power input and the second detection node; and
a controller,
wherein a conductive path between the first detection node and the second detection node is set conductive via the sealing body in one of the first position and the second position,
wherein the first detection node is connected to the first power input, and the second detection node connected to the second power input, and
wherein the controller is configured to detect a conductivity of the conductive path based on a voltage drop over the shunt resistor and to output a signal corresponding to the conductivity of the conductive path.

2. The thermal runaway detection system according to claim 1, wherein the venting device is in a housing and is configured to move from the first position to the second position when a pressure within the housing exceeds a reference pressure.

3. The thermal runaway detection system according to claim 2, wherein the sealing body is reversibly moveable between the first position and the second position.

4. The thermal runaway detection system according to claim 2, wherein the conductive path between the first detection node and the second detection node is set conductive via the sealing body in the first position, and
wherein the conductive path is set non-conductive in the second position.

5. The thermal runaway detection system according to claim 2, wherein the controller is connected to the first power input and to the second power input and is powered via the battery cell.

6. The thermal runaway detection system according to claim 5, wherein the controller is configured to output the signal when the conductive path is set conductive.

7. The thermal runaway detection system according to claim 5, wherein the controller is configured to output the signal when a current across the conductive path falls below a reference current.

8. A battery submodule comprising:
a plurality of aligned battery cells; and
a submodule housing enclosing the aligned battery cells and the thermal runaway detection system of claim 1,
wherein the venting device is in the venting passage of the submodule housing.

9. A vehicle comprising:
the battery submodule according to claim 8; and
a vehicle control unit configured to receive a signal output from the controller and to output a warning according to the received signal.

10. A battery module comprising:
a plurality of battery submodules;
a module housing; and
the thermal runaway detection system of claim 1,
wherein the venting device is in the venting passage of the module housing.

11. A vehicle comprising:
the battery module according to claim 10; and
a vehicle control unit configured to receive a signal output from the controller and to output a warning according to the received signal.

12. A battery system comprising:
a plurality of battery modules;
a system housing; and
the thermal runaway detection system of claim 1,
wherein the venting device is in the venting passage of the system housing.

13. A vehicle comprising:
the battery system according to claim 12; and
a vehicle control unit configured to receive a signal output from the controller and to output a warning according to the received signal.

14. A method for detecting a thermal runaway of a battery cell from among a plurality of battery cells within a housing, the housing comprising a venting device comprising a sealing body in a venting passage of the housing, the sealing body being configured to close the venting passage in a first position and to open the venting passage in a second position different from the first position in response to a reference pressure within the housing, the sealing body being configured to set a conductive path conductive in one of the first position and the second position and to set the conductive path non-conductive in the other of the first position and the second position, the method comprising:
detecting, via a controller configured to detect a conductivity of the conductive path based on a voltage drop over a shunt resistor interconnected between a power input and a detection node, a conductive state of the conductive path and outputting a first signal in response to detecting the conductive state; and detecting, via the controller, a non-conductive state of the conductive path and outputting a second signal in response to detecting the non-conductive state, wherein the second signal indicates a thermal runaway of the battery cell.

15. The method according to claim 14, further comprising:

outputting a warning and/or performing at least one countermeasure in response to the second signal; and stopping the output of the warning and/or the performance of the countermeasure in response to the first signal.

* * * * *